United States Patent
Doris et al.

(10) Patent No.: US 6,989,323 B2
(45) Date of Patent: Jan. 24, 2006

(54) METHOD FOR FORMING NARROW GATE STRUCTURES ON SIDEWALLS OF A LITHOGRAPHICALLY DEFINED SACRIFICIAL MATERIAL

(75) Inventors: Bruce B. Doris, Brewster, NY (US); Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 10/709,314

(22) Filed: Apr. 28, 2004

(65) Prior Publication Data

US 2005/0245008 A1    Nov. 3, 2005

(51) Int. Cl.
*H01L 21/3205* (2006.01)
*H01L 21/4763* (2006.01)

(52) U.S. Cl. .................. 438/596; 438/585; 438/720

(58) Field of Classification Search ................ 438/279, 438/585, 596, 689, 720, 947; 257/401
See application file for complete search history.

(56) References Cited

U.S. PATENT DOCUMENTS 6,383,872 B1    5/2002  Kadosh et al.
6,391,525 B1    5/2002  Lyons
6,638,810 B2   10/2003  Bakli et al.

OTHER PUBLICATIONS

S. Deevi and Z. A. Munir; "The Mechanism of Synthesis of Titanium Nitride by Self-Sustaining Reactions;" Journal of Materials Research Society, Vo. 5, No. 10, Oct. 1990; pp. 2177-2183.

J. Hartmann, W. ensinger, A. Koniger, B. Stritzker, and B. Rauschenbach; "Formation of Titanium Nitride Coatings by Nitrogen Plasma Immersion Ion Implantation of Evaporated Titanium Films;" Journal of American Vacuum Society Technology, A 14(6); Nov./Dec. 1996; pp. 3144-3146.

Y. L. Zou, T. L. Alford, Y. Zeng, F. Deng, S. S. Lau, T. Laursen, A. I. Amali, and B. M. Ullrich; "Formation of Titanium Nitride by Annealing Ag/Ti Structures in Ammonia Ambient;" Journal of Applied Physics vol. 82, (7).1; Oct. 1997; pp. 3321-3327.

M. F. C. Willlemsen, A. E. T. Kuiper, A. H. Reader, R. Hokke, and J. C. Barbour; "In Situ Investigation of TiN Formation of Top of TiSi2;" Journal of Vacuum Science Technology, B6(1), Jan./Feb. 1988; pp. 53-61.

Y. Takahashi, H. Ishii, and J. Murota; "New Platinum Silicide Formation Method Using Reaction Between Platinum and Silane;" Journal of Applied Physics, 58 (8), Oct. 15, 1985; pp. 3190-3194.

S. Hymes, Sp. P. Murarka, C. Shepard, and W. A. Lanford; "Passivation of Copper by Sillicide Formation of Dilute Silane;" Journal of Applied Physics, 71 (9), May 1, 1992; pp. 4623-4625.

(Continued)

*Primary Examiner*—George Fourson
*Assistant Examiner*—Fernando L. Toledo
(74) *Attorney, Agent, or Firm*—Lisa U. Jaklitsch; Cantor Colburn LLP

(57) ABSTRACT

A method for forming a gate structure for a semiconductor device includes defining a conductive sacrificial structure on a substrate, forming a reacted metal film on sidewalls of the conductive sacrificial structure, and removing unreacted portions of the conductive sacrificial structure.

20 Claims, 5 Drawing Sheets

OTHER PUBLICATIONS

S. Humes, K.S. Kumar, S.P. Murarka, P. J. Ding, W. Wang, and W.A. Lanford; "Thermal Stability of Copper Silicide Passivation Layers in Copper-Based Multilevel Interconnects;" Journal of Applied Physics, Vo. 83, No. 9, Apr. 15, 1998; pp. 4507-4512.

L. H. Dubois and R.G. Nuzzo; "Reactivity of Intermetallic Thin Films Formed by the Surface Mediated Decompositio of Main Group Organometallic Compounds;" Journal of Vacuum Science Technologies, A2 (2), Apr.-Jun. 1984; pp. 441-445.

L. Dubois and R. Nuzzo; "The Decomposition of Silane and Germane on Ni(111): Implications for Heterogeneous Catalysis;" Surface Science 149; 1985; pp. 133-145.

T. Abe, Y. G. Hong, M. Esashi; "Highly Selective Reactive-Ion Etching Using CO/NH3/Xe Gases for Microstructuring of Au, Pt, Cu, and 20% Fe-Ni;" Journal of Vacuum Science Technology, B21(5), Sep./Oct. 2003; pp. 2159-2162.

N. Matsui, K. Mashimo, A. Egami, A. Konishi, O. Okada, T. Tsukada; "Etching Characteristics of Magnetic Materials (Co, Fe, Ni) Using CO/NH3 Gas Plasma for Hardening Mask Etching;" Vacuum 66, 2002; pp. 479-485.

METHOD FOR FORMING NARROW GATE STRUCTURES ON SIDEWALLS OF A LITHOGRAPHICALLY DEFINED SACRIFICIAL MATERIAL

BACKGROUND OF INVENTION

The present invention relates generally to semiconductor manufacturing processes, and, more particularly, to a method for forming narrow gate structures on sidewalls of a lithographically defined sacrificial material.

In the semiconductor industry, there is a continuing trend toward higher device densities. To achieve these high densities, there has been and continues to be efforts toward scaling down the device dimensions on semiconductor wafers. In order to accomplish such high device packing density, smaller and smaller features sizes are required. This includes the width and spacing of conductive features and the surface geometry, such as corners and edges of various features. Since numerous conductive features are typically present on a semiconductor wafer, the trend toward higher device densities is a notable concern.

The requirement of small features (and close spacing between adjacent features) in turn requires high-resolution photolithographic processes. In general, lithography refers to processes for pattern transfer between various media. More specifically, it is a technique used for integrated circuit fabrication in which a silicon slice (i.e., the wafer) is coated uniformly with a radiation-sensitive film (i.e., the resist), and an exposing source (such as optical light, X-rays, or an electron beam) illuminates selected areas of the surface through an intervening master template (i.e., the photomask) for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating, thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, such lithography is not without limitations. Patterning features having dimensions of about 0.10 µm or less with acceptable resolution is difficult at best, and almost impossible in certain circumstances. At these dimensions, the tolerances become very difficult to control. Patterning conductive features, including conductive lines and conductive silicon substances (such as amorphous silicon and polysilicon), with small dimensions is required in order to participate in the continuing trend toward higher device densities.

As chip dimensions are scaled to 90 nanometers and below, it is becoming increasingly difficult to scale the device tolerances around those dimensions. For example, at the 90 nm technology, existing best case through-pitch behavior for a 55 nm gate conductor is about 10 nm. However, this 10 nm value does not include other sources of across-chip linewidth variation (ACLV) such as mask variation, optical aberrations and focus variation. For the 65 nm mode, there currently exists 40 nm of through-pitch critical dimension (CD) variation for the gate conductor (without optical proximity correction), using alternate phase shifting masks (PSM).

Accordingly, it has become desirable to obtain alternative methods of scaling the gate conductor that provide enhanced resolution, tolerance control, and improved critical dimension values.

SUMMARY OF INVENTION

The foregoing discussed drawbacks and deficiencies of the prior art are overcome or alleviated by a method for forming a gate structure for a semiconductor device. In an exemplary embodiment, the method includes defining a conductive sacrificial structure on a substrate, forming a reacted metal film on sidewalls of the conductive sacrificial structure, and removing unreacted portions of the conductive sacrificial structure.

In another embodiment, a method for forming a gate structure for a semiconductor device includes forming a gate dielectric material on a substrate, forming an etch stop layer over the gate dielectric material, forming a conductive layer over the etch stop layer, and forming a protective layer over the conductive layer. Portions of the protective layer and the conductive layer are patterned and removed so as to define a conductive sacrificial structure and a protective cap thereupon. A reacted metal film is formed on sidewalls of the conductive sacrificial structure by reacting the conductive sacrificial structure with a reactive gas in the presence of heat. At least a portion of the protective cap, exposed unreacted portions of the conductive sacrificial structure, and exposed portions of the etch stop layer are then removed.

In still another embodiment, a method for forming a gate structure for a semiconductor device includes forming a gate dielectric material on a substrate, forming an etch stop layer over the gate dielectric material, forming a conductive layer over the etch stop layer, and forming a protective layer over the conductive layer. Portions of the protective layer and the conductive layer are patterned and removed so as to define a conductive sacrificial structure and a protective cap thereupon. A reacted metal film is formed on sidewalls of the conductive sacrificial structure by annealing the conductive sacrificial structure and a thermally reactive layer formed in contact with the sidewalls of the conductive sacrificial structure. The protective cap, unreacted portions of the conductive sacrificial structure and the thermally reactive layer, and exposed portions of the etch stop layer are then removed.

BRIEF DESCRIPTION OF DRAWINGS

Referring to the exemplary drawings wherein like elements are numbered alike in the several Figures.

DETAILED DESCRIPTION

Disclosed herein is a method for forming narrow gate structures having tolerance values independent of existing photolithography constraints. Briefly stated, the narrow gate structures are formed on sidewalls of a lithographically defined, conductive sacrificial structure (mandrel) in which the sidewalls of the sacrificial structure are subjected to a surface limited reaction to form, for example, a metal silicide or metal nitride film. In one embodiment, the sidewall reaction may be implemented through a gaseous reaction with the conductive sidewall material. In another embodiment, the sidewall film forming the gate structures are created through annealing of a spacer material (e.g., silicon) formed over the patterned sacrificial material. Regardless of the specific embodiment, the uniformity of the resulting gate structures is determined by the uniformity of the sidewall film growth, which does not suffer from the large through-pitch variations typically associated with conventional optical lithographic techniques.

Figure 1A:
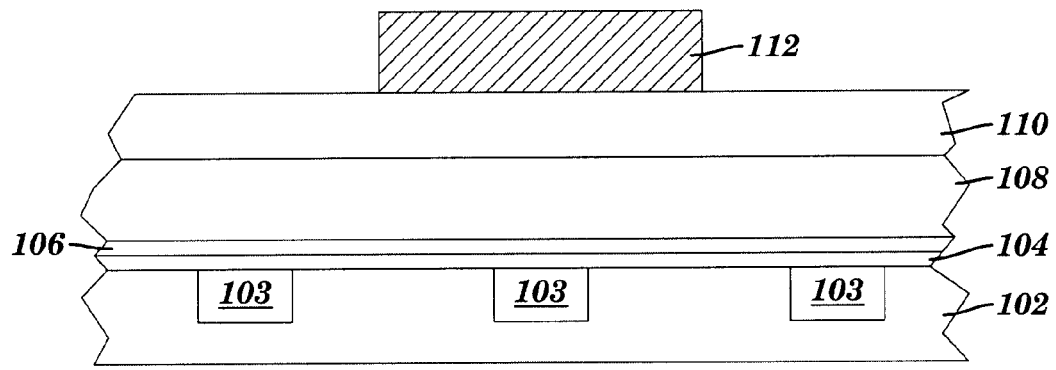
FIGS. 1(a) through 1(f) are cross sectional views of a series of process flow steps illustrating a method for forming narrow gate structures, in accordance with an embodiment of the invention.

Referring initially to FIGS. 1(a) through 1(f), there is shown a series of process flow steps illustrating a method for forming narrow gate structures on sidewalls of a lithographically defined sacrificial material, in accordance with an embodiment of the invention. As shown in FIG. 1(a), a substrate 102 (e.g., silicon) having a plurality of isolation structures 103 (e.g., silicon dioxide) formed therein is provided with a gate dielectric material 104 (e.g., silicon dioxide) formed thereon. Then, a thin conductive etch stop layer 106 such as tungsten or tantalum nitride for example, is formed over the gate dielectric material 104 at an exemplary thickness of about 5 nanometers (nm). Other suitable conductive etch stop materials may include metal suicides such as $WSi_x$, $TaSi_x$, $TiSi_x$, $PdSi_x$ and $PtSi_x$.

An electrically conductive layer 108 is then formed over the etch stop layer 106, the conductive layer 108 being used for the subsequently defined sacrificial structure. In one embodiment, the conductive layer 108 may be cobalt, nickel, titanium, tantalum, palladium, platinum or other suitable material formed at an exemplary thickness of about 100 nm. Disposed atop conductive layer 108 is a protective dielectric layer 110 such as silicon oxide or nitride, formed at an exemplary thickness of about 40 nm. An antireflective coating may also be used as the protective layer 110.

Figure 1B:
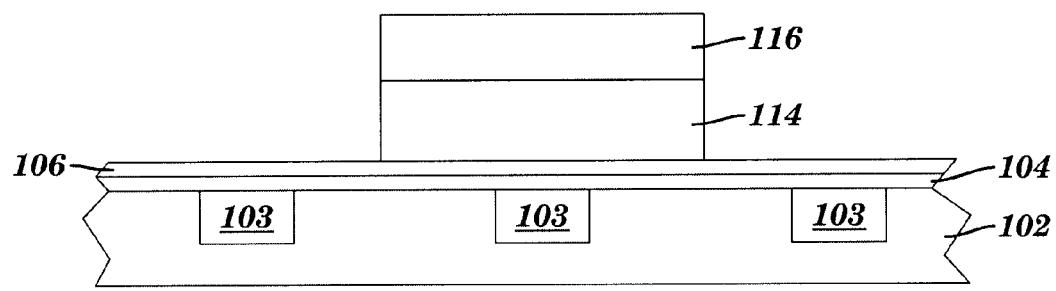

As also shown in FIG. 1(a), the resulting film stack is patterned with an applied photoresist layer 112 developed into the desired pattern of the sacrificial structure (mandrel). As shown in FIG. 1(b), the resulting mandrel pattern is transferred to the protective layer 110 and the conductive layer 108, after which the remaining resist is removed. Thereby, a sacrificial structure 114 is formed having a protective cap 116 disposed thereon.

Figure 1C:
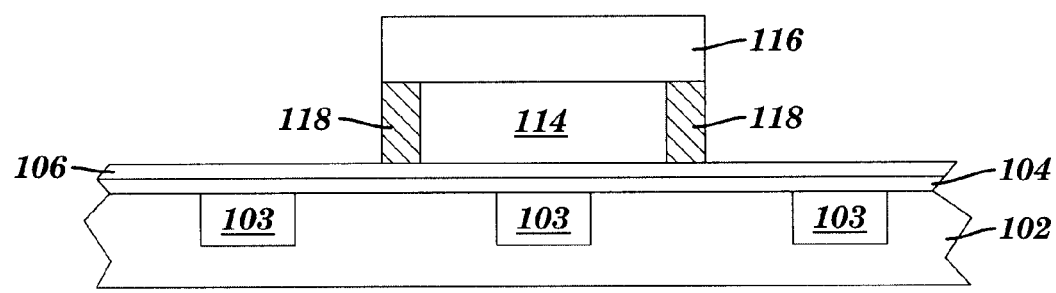

In an exemplary embodiment, the conductive sacrificial structure 114 is then reacted with a reactive gas (for example, a silane gas) in the presence of heat. Suitable reactive gases may include, but are not necessarily limited to, for example, $SiH_4$, $NH_3$ or $N_2$ plasma. Thus, if cobalt is used as the material for the conductive sacrificial structure 114, the reaction of the cobalt with a silane gas results in a thin cobalt silicide film 118 formed along the exposed sidewalls of the sacrificial structure 114, as shown in FIG. 1(c). Because the metal silicide (or metal nitride) film 118 is initially formed around the entire perimeter of the sacrificial structure 114 following the gas reaction, a trim mask may be used to remove the film on the opposing orthogonal edges of the sacrificial structure 114 with respect to the desired location of the gate structures. This is done to prevent shorting of the resulting pair of gate conductors to one another.

It should be noted at this point that the reacted metal film 118 formed on the sidewall perimeter of the sacrificial structure 114 of FIG. 1(c) could also be left intact so as to define a larger gate structure (at desired locations on the substrate 102). In other words, if a plurality of sacrificial structures are initially formed on the substrate 102, certain of those selected structures can be left intact after sidewall reaction, while certain other selected structures could each be trimmed to define a pair of narrow gate conductors, as further described hereinafter. This provides additional process flexibility in that the same steps can be used in the formation of both wide and narrow gate structures, depending on the location thereof.

Figure 1D:
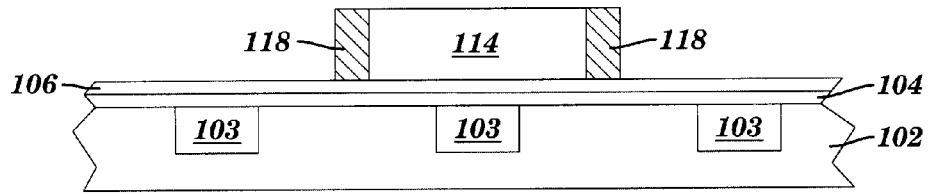
Figure 1E:
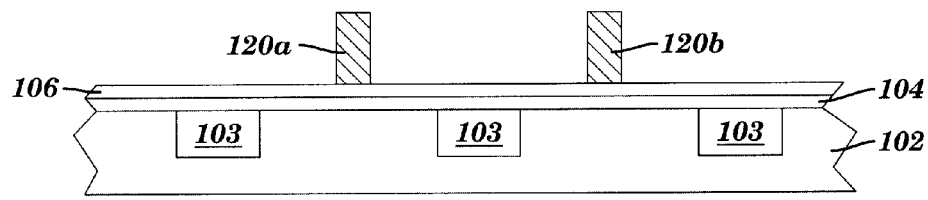
Figure 1F:
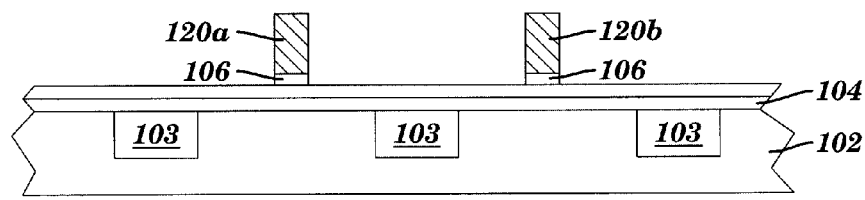

Proceeding now to FIG. 1(d), the protective cap 116 is removed (such as by etching for example) in a manner such that the etch stop layer 106 continues to protect the gate dielectric layer 104. Then, as shown in FIG. 1(e), at locations where narrow gate structures are desired, the remaining portions of unreacted cobalt from the sacrificial structure 114 are removed by a suitable etch process so as to define individual narrow gates 120a, 120b. Again, because of the earlier trimming process, the gates 120a, 120b are not shorted to one another from the reacted metal material initially formed on the orthogonal sidewalls of sacrificial structure 114. Finally, as shown in FIG. 1(f), the exposed portions of the etch stop layer 106 are removed by reactive ion etching (RIE), for example, and the device processing may then be continued in accordance with techniques known in the art.

Figure 2A:
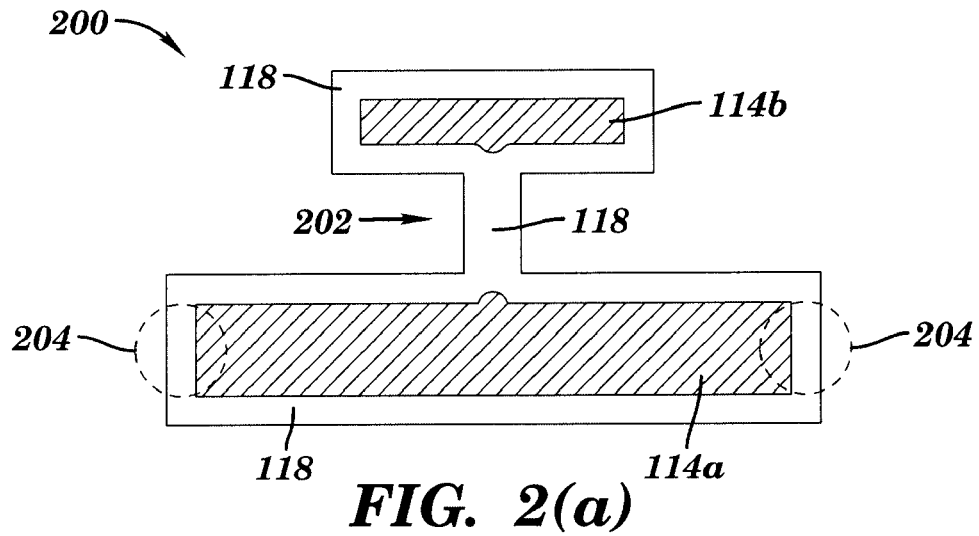
FIGS. 2(a) through 2(c) are top down views illustrating an alternative patterning embodiment for forming both narrow and wide gate structures.

In an alternative patterning embodiment, selected portions of the protective cap 116 may be selectively removed in preparation for isotropic etching of exposed, unreacted portions of the metal sacrificial structure 114. This type of patterning may be used, for example to form wide features on some areas of a chip (i.e., features including both reacted metal film 118 and unreacted metal film 114), while narrow features (i.e., just reacted metal film 118) may be formed on other parts of the chip. For example, FIG. 2(a) is a top down view of a T-shaped pattern 200 that can be formed from the original conductive layer 108 and protective layer 110. After the gas reaction, the metal silicide (or metal nitride) film 118 is formed around the entire perimeter of the T-shaped pattern 200. Because the T-shaped pattern includes a narrow neck portion 202, the entire thickness of original conductive layer is reacted in the neck portion, thus leaving discrete sacrificial structures 114a, 114b.

Figure 2B:
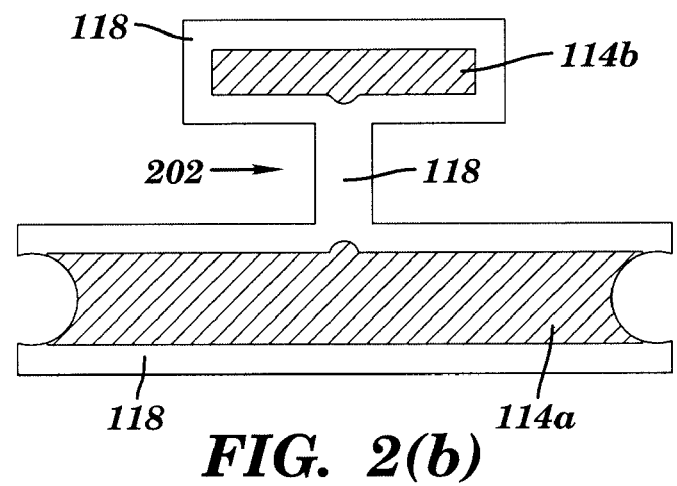
Figure 2C:
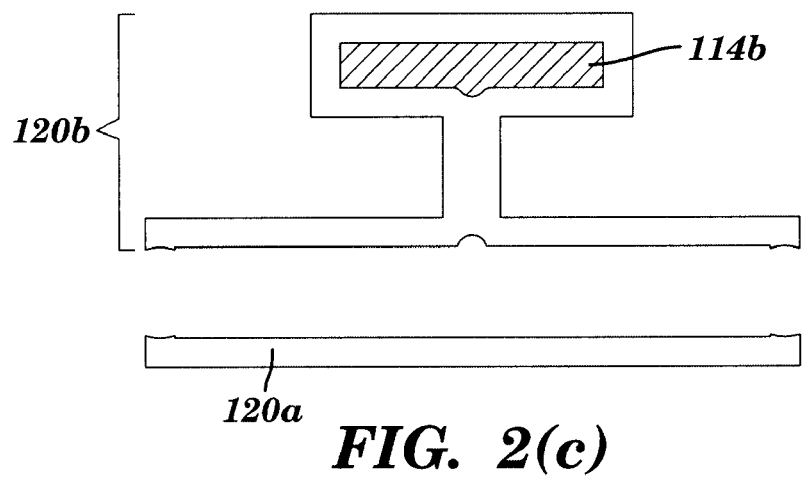

Then, a pair of openings 204 are defined within the protective cap 116 covering the T-shaped pattern 200. This serves at least two purposes, as shown in FIG. 2(b). First, the side loops of reacted metal film 118 are removed so as to sever the film into discrete structures. Second, the sidewalls of sacrificial structure 114a are now exposed. As such, sacrificial structure 114a may be removed by directional etching, while sacrificial structure 114b remains protected by the surrounding reacted film 118. Accordingly, a pair of differently shaped gates is formed as can be seen by narrow gate 120a and wide gate 120b.

Figure 3A:
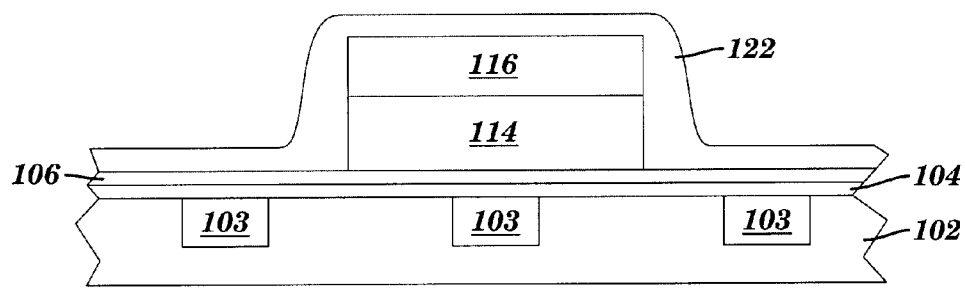
FIGS. 3(a) through 3(d) are cross sectional views depicting an alternative embodiment of the process flow method of FIGS. 1(a) through 1(f).
Figure 3B:
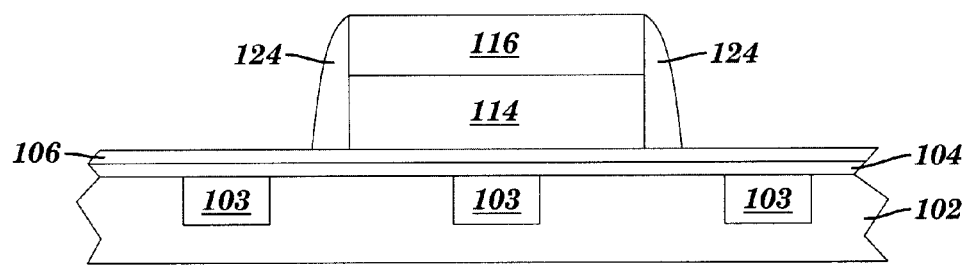

It will also be appreciated that the introduction of the reacted metal film layers 118 in the sidewalls of the sacrificial structure 114 may be implemented by alternative processes, in addition to gaseous reaction. For example, FIGS. 3(a) through 3(d) depict an alternative embodiment in which a reactive spacer material is formed over the patterned sacrificial structure 114 and thereafter annealed to form the sidewall gate conductors. In particular, FIG. 3(a) illustrates the formation of a solid, thermally reactive layer 122 (such as silicon layer) over the patterned sacrificial structure 114 and protective cap 116. Optionally, the reactive layer 122 may be directionally etched so as to create sidewall spacers 124 around the sidewalls of the sacrificial structure 114 and protective cap 116 as shown in FIG. 3(b).

Figure 3C:
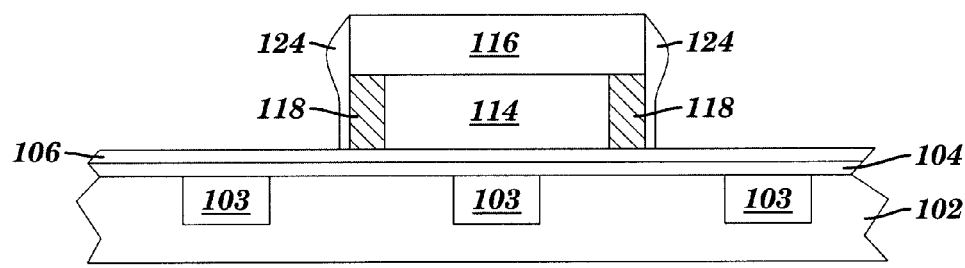
Figure 3D:
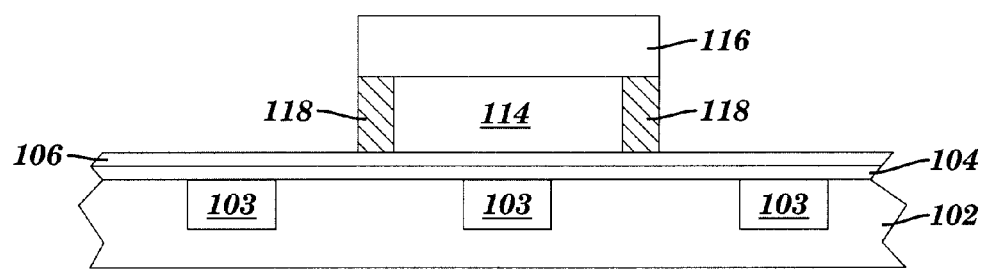

Next, an annealing step causes diffusion of the atoms of the layer 122 into the atoms of the conductive sacrificial structure. If the sidewall spacer material comprises silicon for example, then the anneal results in silicidation of the sidewalls of the conductive sacrificial structure 114 (e.g., cobalt silicide) to form a silicide film 118, as shown in FIG. 3(c). Thereafter, unreacted portions of the sidewall spacers 124 are removed, as shown in FIG. 3(d). At this point, the processing stage is generally equivalent to that shown in FIG. 1(c), and may then proceed to complete the narrow gate formation as described above. As also indicated earlier, the reactive layer 122 need not be etched to specifically create the spacers 124, but could instead be directly annealed after being conformally deposited in FIG. 3(a). The thermal silicidation (or nitridation) reaction of the conductive sacrificial structure sidewalls still results in the formation of the reacted metal film 118, after which the unreacted portions of reactive layer 122 are removed.

Through the implementation of one or more of the above described embodiments, the formation of narrow gate structures may be attained in a manner independent from conventional lithographic processes. Additionally, process simplicity is also provided as a result of eliminated extra deposition and etch processes. The uniformity of the gate conductor is largely determined by the uniformity of the growth of the reacted metal film (e.g., cobalt silicide), which does not suffer from the large through-pitch variations that are typically observed with conventional optical lithographic methods.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for forming a gate structure for semiconductor device, the method comprising:
    defining a conductive metal sacrificial structure on a substrate;
    forming a reacted metal film on sidewalls of said conductive metal sacrificial structure; and
    selectively removing unreacted portions of said conductive metal sacrificial structure.

2. The method of claim 1, further comprising forming a protective cap over said conductive metal sacrificial structure prior to forming said reacted metal film.

3. The method of claim 2, further comprising trimming a portion of said reacted metal film.

4. The method of claim 1, wherein said conductive metal sacrificial structure comprises at least one of: cobalt, nickel, titanium, tantalum, palladium, and platinum.

5. The method of claim 4, wherein said reactive metal film comprises at least one of: cobalt silicide, cobalt nitride, nickel silicide, nickel nitride, titanium silicide, and titanium nitride.

6. The method of claim 1, wherein said reacted metal film is formed by reacting said conductive metal sacrificial structure with a reactive gas in the presence of heat.

7. The method of claim 1, wherein said reacted metal film is formed by annealing sidewalls spacers formed on said conductive metal sacrificial structure, said sidewall spacers comprising a thermally reactive material with respect to said conductive metal sacrificial structure.

8. A method for forming a gate structure for a semiconductor device, the method comprising:
    forming a gate dielectric material on a substrate;
    forming an etch stop layer over said gate dielectric material;
    forming a conductive metal layer over said etch stop layer;
    forming a protective layer over said conductive layer;
    patterning and removing portions of said protective layer and said conductive metal layer so as to define a conductive metal sacrificial structure and a protective cap thereupon;
    forming a reacted metal film on sidewalls of said conductive metal sacrificial structure by reacting said conductive metal sacrificial structure with a reactive gas in the presence of heat; and removing at least a portion of said protective cap, selectively removing exposed, unreacted portions of said conductive sacrificial structure, and removing exposed portions of said etch stop layer.

9. The method of claim 8, further comprising trimming a portion of said reacted metal film.

10. The method of claim 9, wherein said trimming further comprises:
    removing a portion of said protective cap and said reacted metal film, thereby reexposing at least one of said sidewalls of said conductive metal sacrificial structure; and
    isotropically etching said reexposed conductive metal sacrificial structure.

11. The method of claim 10, wherein unexposed portions of said conductive metal sacrificial structure are remaining in one of said pair of gate conductors, thereby defining a wider other of said pair of gate structure with respect to the gate conductors.

12. The method of claim 8, wherein said reactive gas comprises at least one of: $SiH_4$, $NH_3$ and $N_2$ plasma.

13. The method of claim 12, wherein said comprises at least one of: cobalt silicide, cobalt reactive metal film nitride, nickel silicide, nickel nitride, titanium siiicide and titanium nitride.

14. A method for forming a gate structure for a semiconductor device, the method comprising:
    forming a gate dielectric material on a substrate;
    forming an etch stop layer over said gate dielectric material;
    forming a conductive metal layer over said etch stop layer;
    forming a protective layer over said conductive metal layer;
    patterning and removing portions of said protective layer and said conductive metal layer so as to define a conductive metal sacrificial structure and a protective cap thereupon;
    forming a reacted metal film on sidewalls of said conductive metal sacrificial structure by annealing said conductive metal sacrificial structure and a thermally reactive layer formed in contact with said sidewalls of said conductive metal sacrificial structure; and removing said protective cap, selectively removing unreacted portions of said conductive sacrificial structure and said thermally reactive layer, and removing exposed portions of said etch stop layer.

15. The method of claim 14, further comprising trimming a portion of said reacted metal film.

16. The method of claim 15, wherein said conductive metal sacrificial structure comprises at least one of: cobalt, nickel, titanium, tantalum, palladium and platinum.

17. The method of claim 16, wherein said thermally reactive layer comprises a silicon layer.

18. The method of claim 17, wherein said reactive metal film comprises at least one of: cobalt silicide, nickel silicide and titanium silicide.

19. The method of claim 14, wherein said etch stop layer comprises at least one of: tungsten, tantalum nitride, tungsten silicide, tantalum silicide, palladium, silicide, platinum silicide and titanium silicide.

20. The method of claim 14, further comprising forming sidewall spacers from said thermally reactive layer prior to annealing thereof.

* * * * *